United States Patent [19]

Cricchi et al.

[11] 4,064,405
[45] Dec. 20, 1977

[54] COMPLEMENTARY MOS LOGIC CIRCUIT

[75] Inventors: James R. Cricchi, Catonsville; Michael D. Fitzpatrick, Glen Burnie, both of Md.

[73] Assignee: Westinghouse Electric Corporation, Pittsburgh, Pa.

[21] Appl. No.: 740,267

[22] Filed: Nov. 9, 1976

[51] Int. Cl.² ............... H03K 19/08; H03K 19/40
[52] U.S. Cl. .................. 307/205; 307/214; 307/264; 307/270; 307/DIG. 1; 307/DIG. 4
[58] Field of Search ............ 307/205, 214, 251, 255, 307/264, 270, DIG. 1, DIG. 4

[56] References Cited

U.S. PATENT DOCUMENTS

| Re. 27,305 | 3/1972 | Polkinghorn et al. ............ 307/251 |
| 3,612,908 | 10/1971 | Heimbigner ................. 307/251 X |
| 3,925,689 | 12/1975 | Rubenstein ............... 307/DIG. 1 X |
| 3,932,848 | 1/1976 | Porat ..................... 307/DIG. 4 X |
| 3,946,245 | 3/1976 | McClaughry ............. 307/DIG. 4 X |
| 4,000,412 | 12/1976 | Rosenthal et al. ............. 307/264 X |
| 4,023,050 | 5/1977 | Fox et al. ................. 307/DIG. 1 X |

FOREIGN PATENT DOCUMENTS 2,365,581  9/1975  Germany ................. 307/DIG. 4

Primary Examiner—John S. Heyman
Assistant Examiner—Larry N. Anagnos
Attorney, Agent, or Firm—J. B. Hinson

[57] ABSTRACT

A complementary MOS logic circuit is disclosed. The circuit utilizes two stages with a coupling network comprising a capacitor and a diode used to couple the first stage to the second stage. This results in a circuit with the logic signal coupled to the input being inverted at the output without introducing substantial loss in signal amplitude.

4 Claims, 3 Drawing Figures

COMPLEMENTARY MOS LOGIC CIRCUIT

STATEMENT STATE OF GOVERNMENT INTEREST

The invention herein described was made in the course of or under Contract No. F-33651-73-C-1093 with the Department of the Air Force.

BACKGROUND OF THE INVENTION

Field of the Invention

The invention relates to electronic circuits and more specifically to complementary MNOS logic circuits.

SUMMARY OF THE INVENTION

The subject of the invention is a complementary MOS logic circuit utilizing an input stage and an output stage. The input stage comprises a first MOS transistor operated as a common gate amplifier which utilizes a depletion mode MOS transistor as a load. A capacitor is coupled between the source and drain of the common gate amplifier. A diode is coupled between the drain of the common gate amplifier and a reference voltage. The input stage is coupled to an output stage which, in a first configuration, utilizes the input signal to the circuit and the signal generated at the drain of the common gate amplifier as an input signal to a complementary output stage to generate an output signal which is substantially the input signal inverted. Modifications of the circuit are also disclosed which permits the input signal to be inverted with one level being shifted in value or both levels of the output signal to be shifted without inversion.

DETAILED DESCRIPTION

Figure 1:
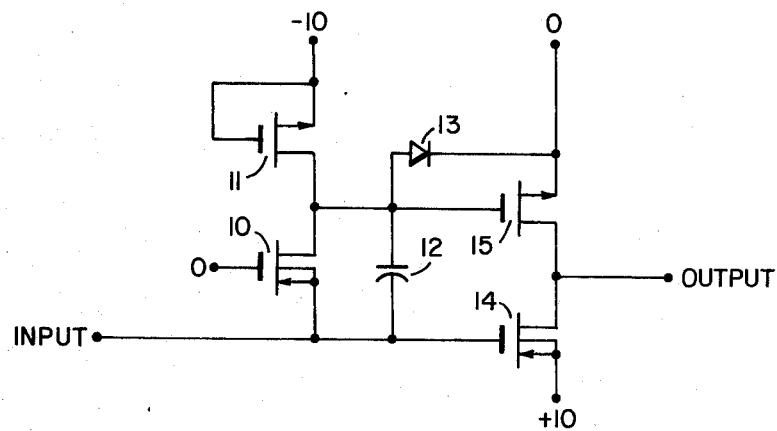
FIG. 1 is a schematic diagram of a complementary MOS inverter circuit.

FIG. 1 is a schematic diagram of the complementary MOS inverter circuit. This circuit is primarily designed to accept logic input signals having a low value of zero volts and a high value of plus ten volts. Other levels of logic signals could obviously be used by suitable adjustment to the various reference voltages utilized by the inverter.

The input signal to the inverter is coupled to the source of a first p-channel in enhancement mode MOS transistor 10. The gate of this transistor is coupled to a first reference voltage, preferably in the range of 0 volts DC. The drain terminal of transistor 10 is coupled to the drain terminal of an n-channel depletion mode MOS transistor 11. The gate and source terminals of the n-channel depletion mode MOS transistor 11 are connected in common and to a second reference potential preferably in the range of −10 volts DC.

A capacitor 12 is coupled between the source terminal of the p-channel enhancement mode MOS transistor 10 and the drain of this transistor. A diode 13 is coupled between the drain of the p-channel MOS transistor 10 and a third reference voltage, preferably in the range of 0 volts DC.

The input signal is also coupled to the gate terminal of a second p-channel enhancement mode MOS transistor 14. The source of this transistor is connected to a fourth reference voltage, preferably in the range of +10 volts DC.

A depletion mode n-channel MOS transistor 15 has its drain terminal connected to the drain terminal of the p-channel enhancement mode MOS transistor 14 with the junction thereof forming the output terminal of the inverter. The gate of the n-channel depletion mode MOS transistor 15 is coupled to the junction formed by connecting the respective drains of p-channel enhancement mode MOS transistor 10 and depletion mode n-channel MOS transistor 11.

The operation of the circuit illustrated in FIG. 1 will first be described with reference to the +10 level of the input signal. The +10 value of the input signal is coupled to the source terminal of p-channel enhancement mode MOS transistor 10. As previously described, the gate of this transistor is coupled to approximately 0 volts DC. This causes this transistor to turn on. Under these conditions, the current flowing through p-channel enhancement mode transistor 10 divides between diode 13 and the depletion mode load transistor 11. This causes the gate of n-channel enhancement mode MOS transistor 15 to be approximately 0.7 volts DC and the gate voltage of p-channel enhancement mode MOS transistor 14 to be approximately +10 volts. This causes the n-channel transistor 15 to turn on and the p-channel transistor 14 to turn off. The low resistance state of the n-channel transistor 15 causes the voltage at the junction formed by the common connection of the drains of n-channel transistor 15 and p-channel 14 to go to 0 volts DC. Thus, the +10 volt value of the input signal has been inverted to generate the 0 level of the logic signal.

When the level of the input signal switches from the previously described +10 volts to 0 volts DC, p-channel transistor 10 turns off. The negative going transition of the input signal is coupled directly through capacitor 12 to the gate terminal of n-channel transistor 15, causing this transistor to turn off rapidly. Depletion mode n-channel transistor 11 is still in the conducting state and maintains the gate of n-channel transistor 15 at −10 volts. The low level of the input signal is also coupled directly to the gate terminal of p-channel MOS transistor 14 causing this transistor to turn on and shift the output voltage at the drain terminal of this transistor to +10 volts. When the input signal agains shifts from 0 to +10, this transition is immediately coupled to the gate of the n-channel MOS transistor 15 by capacitor 12 turning on this transistor. p-channel MOS transistor 10 is also turned on to maintain the gate voltage of the n-channel transistor 15 at +0.7 volts and provide a small current which flows through diode 13. p-channel MOS transistor 14 is also immediately turned off by the plus value of the input signal. Thus, it can be seen that either n-channel MOS transistor 15 or p-channel MOS transistor 14 are always off, with p-channel MOS transistor 10 being either on or off, depending on the value of the input signal. Depletion mode n-channel transistor 11 is always on.

Figure 2:
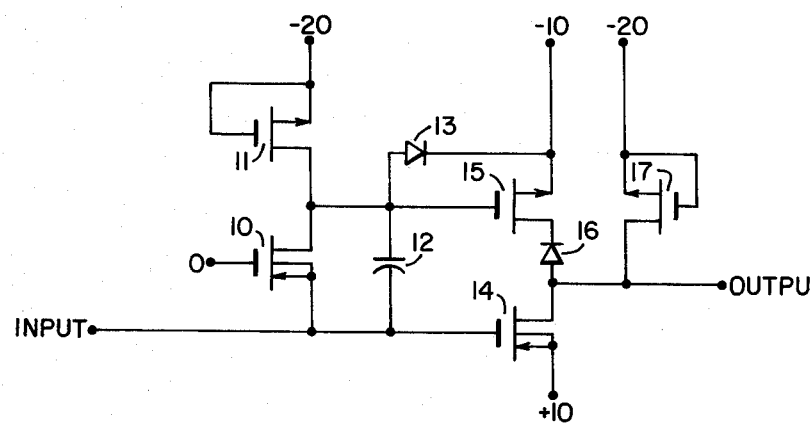
FIG. 2 is a schematic diagram of the inverter shown in FIG. 1 modified to shift the positive level of the output signal.

FIG. 2 is a schematic diagram of the basic inverter modified to generate an output signal having logic levels of −20 and +10 in response to an input signal having logic levels of +10 and 0. The modification consists of changing some of the reference voltages and adding a network to the output consisting of a diode 16 and an n-channel depletion mode MOS transistor 17. More specifically, the reference voltage coupled to the source of n-channel depletion mode transistor 11 has been changed to −20 volts and the reference voltage coupled to the source of n-channel depletion mode transistor 15 has been changed to −10 volts. MOS transistors 10, 11, 15 and 16 are on and off in the same sequence as previously described with capacitor 12 and diode 13 also performing identical functions. The change in reference voltages causes the gate of MOS transistor 15 to have a voltage level of −9.3 volts when the input signal has a level of +10 volts and a voltage of −20 volts when the input signal is 0. This is a direct result of the change in the reference voltages, and not a result of any circuit modification. The changes in the reference voltage in the absence of the additional diode 16 and transistor 17 results in the output signal having a −10 value for the +10 value of the input signal and a +10 value for the 0 level of the input signal. Thus, the previously described 0 level of the output signal has been shifted to −10 volts.

In the modified inverter n-channel depletion mode MOS transistor 17 is always on and couples the −20 volt reference signal to the output terminal when the p-channel transistor 14 is off. This reverse biases diode 16, except during transitions when transistor 15 is on and the output signal is more positive than −10 volts, preventing substantial current from flowing in n-channel transistor 15. This shifts the negative level of the output signal to −20 volts without altering the +10 value of this signal. The dimensions of transistors 14 and 17 are selected such that transistor 17 has negligible effect on the output voltage when transistor 14 is on.

Figure 3:
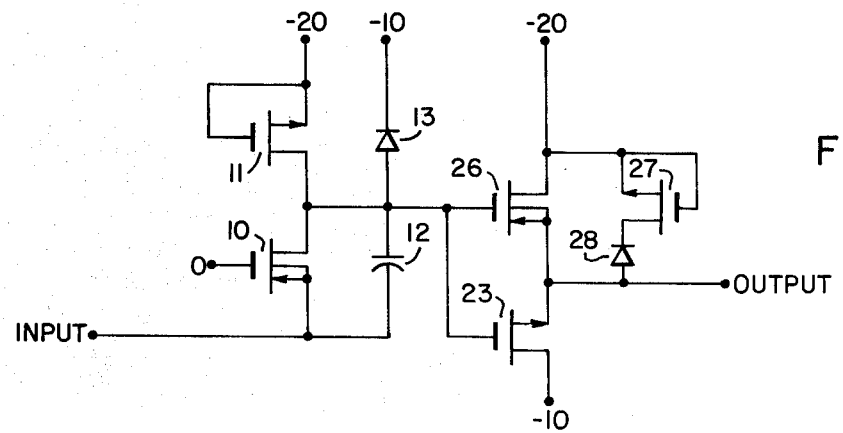
FIG. 3 is a schematic diagram of the circuit illustrated in FIG. 1 modified to shift the level of the input signal to more negative values without inversion.

FIG. 3 illustrates still another modification of the circuit which permits the +10 and O logic levels of the input signal to be shifted to −10 and −20 volts without inversion. In this modified circuit MOS transistors 10 and 11, as well as diode 13 and capacitor C12 perform precisely as previously described. However, the output section of the circuit has been modified to prevent the input signal from being inverted and to shift the logic levels at the output terminal. The modified output stage includes an n-channel depletion mode transistor 23 and a p-channel enhancement mode 26 having their gates connected in common and to the drain terminal of MOS transistors 10 and 11. Thus, the voltage at the gate of transistors 23 and 26 will be approximately −9.3 volts when the input signal is +10 and approximately −20 volts when the input signal is 0, as previously described.

When the gate of n-channel MOS transistor 23 is approximately −9.3 volts, this transistor is turned on, coupling the −10 volt reference signal to the output terminal. The −9.3 volt signal also turns off the p-channel MOS transistor 26. A small amount of current will flow through transistor 23, diode 28 and depletion mode transistor 27 to the −20 reference voltage. However, the parameters of transistors 23 and 27 can be adjusted such that the output voltage is approximately −10 volts. When the input signal is switched to 0 volts, the voltage coupled to the gates of transistors 23 and 26 switches to approximately −20 volts. This turns off transistor 23 and turns on transistor 26. The threshold voltage of transistor 26 prevents the entire 20 volts from being coupled to the output terminal by this transistor. However, depletion mode transistor 27 is always on causing the output voltage to go to approximately −20 volts DC independently of the threshold voltage of transistor 26.

The circuits described in detail above can be constructed using conventional MOS processes. However, the disclosed circuit is believed to be most advantageous when constructed as a silicon or sapphire integrated circuit.

I claim:
1. An inverter circuit having at least one input terminal and at least one output terminal, comprising:
 a. a first p-channel MOS transistor having its source coupled to said at least one input terminal of said inverter circuit and its gate coupled to a first reference voltage;
 b. a first n-channel MOS transistor having its drain connected to the drain of said first p-channel MOS transistor and its gate and source to a second reference voltage;
 c. a capacitor coupled between the drain and source of said first p-channel MOS transistor;
 d. a second p-channel MOS transistor having its source coupled to a third reference voltage and its gate to said at least one input terminal;
 e. a second n-channel MOS transistor having its drain coupled to the drain of said second p-channel MOS transistor to form said at least one output terminal of said inverter and its gate coupled to the junction formed by connecting the drain of said first p-channel MOS transistor to the drain of said first n-channel MOS transistor; and
 f. a diode coupled between the gate and source of said second n-channel MOS transistor.

2. A non-inverting MOS driver circuit having at least one input terminal and at least one output terminal, comprising:
 a. a first p-channel MOS transistor having its source connected to said at least one input terminal of said driver and its gate to a first reference voltage;
 b. a first n-channel MOS transistor having its drain connected to the drain of said first p-channel MOS transistor to form said at least one output terminal and its gate and source to a second reference voltage;
 c. a capacitor connected between the drain and source of said first p-channel MOS transistor; and
 d. a diode coupled between the junction formed by connecting the drain of said first p-channel MOS transistor to the drain of said first n-channel MOS transistor and a third reference voltage.

3. An MOS inverter having at least one input terminal and at least one output terminal circuit comprising:
 a. a first p-channel MOS transistor having its source connected to said at least one input terminal of said inverter and its gate to a first reference voltage;
 b. a first n-channel MOS transistor having its drain connected to the drain of said first p-channel MOS transistor and its gate and source terminal to a second reference voltage;
 c. a capacitor connected between the drain and source terminals of said first p-channel MOS transistor;
 d. a second p-channel MOS transistor having its source coupled to a third reference voltage, its gate coupled to said at least one input terminal and its drain to said at least one output terminal;
 e. a second n-channel MOS transistor having its drain coupled to the drain of said second p-channel MOS transistor through a first diode and its gate coupled to the junction formed by connecting the drain of said first p-channel MOS transistor to the drain of said first n-channel MOS transistor and its source to a fourth reference voltage;

f. a second diode coupled between the gate of said second n-channel MOS transistor and said fourth reference voltage;

g. a third n-channel MOS transistor having its source and gate coupled to a fifth reference voltage and its drain to said at least one output terminal.

4. An MOS circuit having at least one input terminal and at least one output terminal, comprising:

a. a first p-channel MOS transistor having its source coupled to at least one input terminal and its gate to a first reference voltage;

b. a first n-channel MOS transistors having its source and gate coupled to a second reference voltage and its drain to the drain of said first p-channel MOS transistor;

c. a capacitor coupled between the drain and source of said first p-channel MOS transistor;

d. a diode coupled between the drain of said first n-channel MOS transistor and a third reference voltage;

e. a second p-channel MOS transistor and a second n-channel MOS transistor having their respective gates connected in common and to the drain terminals of said first p-channel MOS transistor; having their respective source terminals connected in common to form said at least one output terminal and having their respective drain terminals connected to the fourth and fifth reference voltages;

f. a third n-channel MOS transistor having its source and gate terminals connected in common and to said fifth reference voltage; and g. a diode coupled between the drain of said third n-channel MOS transistor and the source terminal of said second p-channel transistor.

* * * * *